United States Patent [19]
Higashi et al.

[11] Patent Number: 5,952,673
[45] Date of Patent: Sep. 14, 1999

[54] OPTICAL SEMICONDUCTOR DEVICE INCLUDING A MULTIPLE QUANTUM WELL STRUCTURE OF AN ALGAINAS/INP SYSTEM

[75] Inventors: Toshio Higashi; Takuya Fujii, both of Kawasaki, Japan

[73] Assignee: Fujitsu Limited, Kanagawa, Japan

[21] Appl. No.: 08/906,858

[22] Filed: Aug. 6, 1997

[30] Foreign Application Priority Data

Dec. 11, 1996 [JP] Japan .................................... 8-330513

[51] Int. Cl.$^6$ .................................................. H01L 29/06
[52] U.S. Cl. ............................. 257/18; 257/17; 257/22; 257/94; 257/103
[58] Field of Search ................................. 257/14, 17, 18, 257/22, 94, 103; 372/45, 46

[56] References Cited

U.S. PATENT DOCUMENTS 5,541,949  7/1996  Bhat et al. ................................ 372/45

OTHER PUBLICATIONS

C.E. Zah et al., "Low Threshold 1.3 μm Strained–Layer A 1 x G a y I n 1–x–y A s / I n P Quantum Well Laster", IEE Electron. Lett, vol. 28, No. 25, pp.2323–2325, Dec. 1992.

C. E. Zah et al., "Low Threshold 1.3 μm Strained–Layer Al x GayIn 1–x–y As/InP Quantum Well Lasers", 13th International Semiconductor Laser Conference, K–5, pp.202–2–3, 1992.

C. E. Zah et al., "High–performance uncooled 1.3 μm A 1 x G a y I n 1–x–y A s / I n P strained–layer quantum–well lasers for subscriber loop applications", IEEE J. Quantum Electron, vol. 30, No. 2, pp.511–523, Feb. 1994.

Z. Wang et al., "high speed, ultralow noise, tensile strained InGaAlAs MQW lasers emitting at 1300 nm for optical communication and microwave applications", IEE Electron. Lett., vol. 30, No. 17, pp.1413–1414, Aug. 1994.

C. E. Zah et al., "High–performance uncooled 1.3 μm A 2 x G a y I n 1–x–y A s / I n P strained–layer quantum–well lasers for fiber–in–the–loop applications", 94 OFC, pp.204–205, 1994.

Z. Wang et al., "High reliability, high–performance, low–cost coaxial laser module at 1.3 μm for local–loop applications", 94 OFC, pp. 145—145, 1994.

C. E. Zah et al., "High–temperature modulation dynamics of 1.3 μm A 1 x G a y I n 1–x–y A s / I n P compressive–strained multiple–quantum well lasers", 14th International Semiconductor Laser Conference, Th1.3, pp.215–216, 1994.

Z. Wang et al., "High speed, ultra low noise operation from –40° C to 100° C tensile strained InGaAlAs MQW lasers emitting at 1300nm", 14th International Semiconductor Laser Conference, PD10, pp.23–24, Sep. 1994.

M.C. Wang et al., "Ultrahigh temperature and ultrahigh speed operation of 1.3 μm strain–compensated A 1 G a I n A s / I n P uncooled laser diodes", IEE Electron. Lett. vol. 31, No. 18, pp. 1584–1585, Aug. 1995.

*Primary Examiner*—Minh Loan Tran
*Attorney, Agent, or Firm*—Armstrong, Westerman, Hattori, McLeland & Naughton

[57] ABSTRACT

The optical semiconductor device comprises a multiple quantum well structure of an AlGaInAs system material formed on an InP semiconductor substrate. The multiple quantum well structure comprises a barrier layer of a below 1.0 μm of PL wavelength and a below 4.5 nm of film thickness active layer alternately laid one on another. An above 0.5% compressive strain is applied to the active layer. Thus the AlGaInAs/InP system optical semiconductor can have good temperature characteristics.

4 Claims, 7 Drawing Sheets

OPTICAL SEMICONDUCTOR DEVICE INCLUDING A MULTIPLE QUANTUM WELL STRUCTURE OF AN ALGAINAS/INP SYSTEM

BACKGROUND OF THE INVENTION

The present invention relates to an optical semiconductor device including a multiple quantum well structure of an AlGaInAs system material formed on an InP semiconductor substrate.

The optical fiber communication is characterized by large quantities of transmitted information per one cable, and insusceptibility to electromagnetic waves. Presently the Japan-U.S.A. international telephone circuits, and the domestic major basic circuits are being replaced by optical fibers. Recently the use of optical fiber circuits for individual subscribers is more motivated.

To realize the optical fiber communication for individual subscribers, semiconductor lasers as light sources must be inexpensive. This hinders the use of temperature control means, and expensive optical members, such as light isolators, etc., which are expensive, and the semiconductor lasers require stability to environmental temperature changes, backward light resistance characteristics, etc.

As optical semiconductor lasers of long wavelengths for communication have been used InGaAsP/InP semiconductor lasers including InGaAsP system materials lattice-aligned on InP semiconductor substrates. However, the semiconductor lasers using this InGaAsP system materials has a disadvantage that with environmental temperature changes, a current value required for laser oscillation abruptly rises with a result that the lasers become unusable.

In view of this AlGaInAs/InP system semiconductor lasers including AlGaInAs system materials formed on InP semiconductor substrates as the semiconductor laser materials of long wavelengths which can be expected to improve temperature characteristics is noted, and the following report is made by C. E. Zah, Z. Wang, M. C. Wang, et al.

1) C. E. Zah et al., "Low Threshold 1.3 $\mu$m Strained-Layer Al$_x$Ga$_y$In$_{1-x-y}$As/InP Quantum Well Lasers", IEE Electron. Lett., vol. 28, No. 25, pp. 2323–2325, Dec. 1992

2) C. E. Zah et al, "Low Threshold 1.3 $\mu$m Strained-Layer Al$_x$Ga$_y$In$_{1-x-y}$As/InP Quantum Well Lasers", 13th International Semiconductor Laser Conference, K-5, pp. 202–203, 1992

3) C. E. Zah et a, "High-performance uncooled 1.3 $\mu$m Al$_x$Ga$_y$In$_{1-x-y}$As/InP strained-layer quantum-well laser for subscriber loop applications", IEEE J. Quantum Electron, vol. 30, No. 2, pp 511–523, Feb. 1994

4) Z. Wang et al, "High speed, ultra low noise, tensile strained InGaAlAs MQW lasers emitting at 1300 nm for optical communication and microwave applications", IEE Electron. Lett., vol. 30, No. 17, pp. 1413–1414, Aug. 1994

5) C. E. Zah et a;, "High-performance uncooled 1.3 $\mu$m Al$_x$Ga$_y$In$_{1-x-y}$As/InP strained-layer quantum-well lasers for fiber-in-the-loop applications", 94 OFC, pp. 204–205, 1994

6) Z. Wang et al, "High-reliability, high-performance, low-cost coaxial laser module at 1.3 $\mu$m for local-loop applications", 94 OFC, pp. 145–146, 1994

7) C. E. Zah et al, "Higher-temperature modulation dynamics of 1.3 $\mu$m Al$_x$Ga$_y$In$_{1-x-y}$As/InP compressive-strained multiple-quantum well lasers", 14th International Semiconductor Laser Conference, Th1. 3, pp. 215–216, 1994

8) Z. Wang et al, "Ultrahigh temperature and ultrahigh speed operation of 1.3 $\mu$m strain-compensated AlGaInAs/InP uncooled laser diodes", IEE Electron. Lett., vol. 31, No. 18, pp. 1584–1585, Aug. 1995

However, unless the AlGaIns/InP system semiconductor lasers have suitable structures, the AlGaInAs/InP system semiconductor lasers can have only the same temperature characteristics as the InGaAsP/InP system semiconductor lasers. According to the reports so far made, no AlGaInAs/InP system semiconductor laser having required good temperature characteristics has not yet been provided.

SUMMARY OF THE INVENTION

An object of the present invention is to provide an AlGaInAs/InP system optical semiconductor device having a device structure which can realize good temperature characteristics.

The above-described object is achieved by the optical semiconductor device an optical semiconductor device including a multiple quantum well structure of an AlGaInAs system material formed on an InP semiconductor substrate, the multiple quantum well structure comprising a barrier layer of a below 1.0 $\mu$m-PL wavelength and an active layer of a below 4.5 nm-thickness alternately laid one on another, an above 0.5% compressive strain being applied to the active layer.

The above-described object is achieved by the optical semiconductor device an optical semiconductor device including a multiple quantum well structure of an AlGaInAs system material formed on an InP semiconductor substrate, the multiple quantum well structure comprising a barrier layer of a below 1.0 $\mu$m-PL wavelength and an active layer of a below 4.5 nm-thickness alternately laid one on another, the active layer being an Al$_x$Ga$_y$In$_{1-x-y}$As layer, an Al composition ratio x and a Ga composition ratio y satisfying formulas stated below $y \leq 0.4-x$ $y \leq 0.55-2.75x$ $x \geq 0$ $y \geq 0.$ In the above-described optical semiconductor device, it is preferable that the multiple quantum well structure is sandwiched by cladding layers of an AlInAs system material.

According to the present invention, the multiple quantum well structure comprises barrier layers of a below 1.0 $\mu$m-PL wavelength, and below 4.5 nm-film thickness active layers alternately laid one on another so that an above 0.5% compressive strain is applied to the active layers, whereby the optical semiconductor device can have a device structure of a AlGaInAs/InP system material which can realize good temperature characteristics.

DETAILED DESCRIPTION OF THE INVENTION

To determine a device structure for realizing good temperature characteristics, the inventors of the present application studied the mechanism for determining temperature characteristics of oscillation threshold current value of a semiconductor laser.

Overflow of carriers from an energy level on which a semiconductor laser is oscillating to an upper energy level is much involved in temperature characteristics of an oscillation threshold current value of the semiconductor laser. In view of this, to improve the temperature characteristics the inventors considered it effective to widen a gap between an energy level on which a semiconductor laser is oscillating, and a next energy level.

As an AlGaInAs/InP system semiconductor laser was used a model device structure including a multi-quantum well of barrier layers of AlGaInAs of a 1.0 μm-PL wavelength and active layers of AlGaInAs of an above 1.0 μm-PL wavelength alternately laid on an InP substrate. Simulations were conducted on AlGaInAs/InP system semiconductor lasers of this device structure to study an optimum device structure. Because of a difference in lattice constant between the InP substrate and the AlGaInAs of the active layers, a compressive strain or a tensile strain is applied to the active layers.

FIGS. 1 to 4 show results of computations in the simulations.

First, energy difference between a first energy level of the active layer and an energy level of the barrier layer will be discussed.

Figure 1:
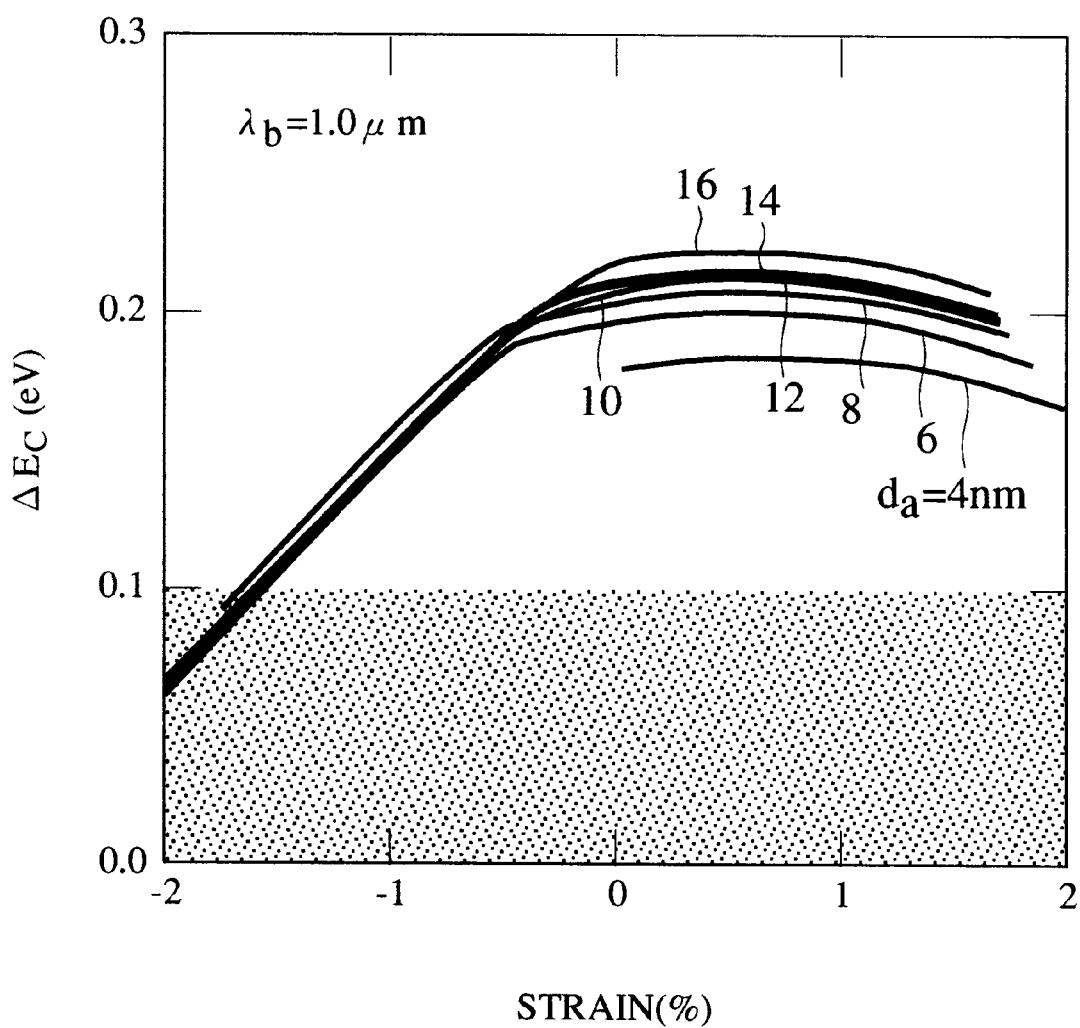
FIG. 1 is a graph of results of simulations of energy differences $\Delta$Ec between a first energy level of an active layer and an energy level of a barrier layer on the side of the conduction band.

FIG. 1 shows the result of the computation on the energy difference ΔEc between the first energy level of the active layer and the energy level of the barrier layer on the side of a conduction band. Strains (%) applied to the active layer 8 are taken on the horizontal axis, and energy differences ΔEc (Ev) are taken on the vertical axis. The positive strain amounts indicate compressive strains, and the negative strain amounts indicate tensile strains. The computation result is of cases that the active layer has a film thickness da from 4 nm to 16 nm. The barrier layer has a 1.0 μm PL wavelength λb.

The graph of FIG. 1 shows that as long as a compressive strain is applied, energy differences ΔEc of above 150 meV far exceeding 100 meV can be obtained.

Figure 2:
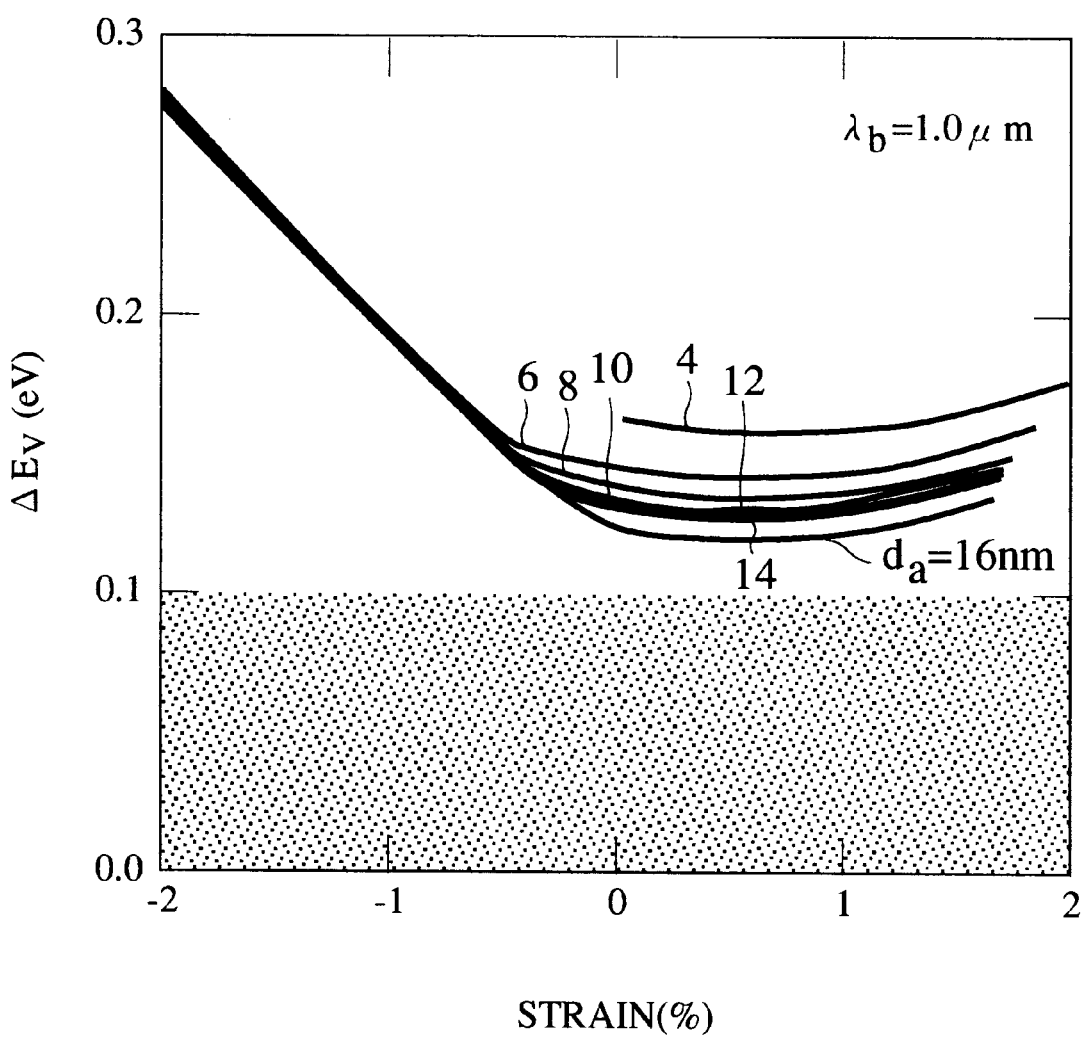
FIG. 2 is a graph of results of simulations of energy differences $\Delta$Ev between a first energy level of an active layer and an energy level of a barrier layer on the side of the valence band.

FIG. 2 shows the result of the computation on the energy difference ΔEv between the first energy level of the active layer and the energy level of the barrier layer on the side of the valence band. Strain quantities (%) applied to the active layer are taken on the horizontal axis, and energy differences ΔEv (eV) are taken on the vertical axis. The positive strain amounts indicate compressive strains, and the negative strain amounts indicate tensile strains. The computation result is of cases that the active layer has a film thickness da from 4 nm to 16 nm. The barrier layer has a 1.0 μm PL wavelength λb.

FIG. 2 shows that the energy differences ΔEv tends to be larger with tensile strains applied, but is found that even with compressive strains applied energy differences ΔEv of above 120 meV exceeding 100 meV can be obtained. Such energy differences ΔEv are considered sufficient because on the side of the valence band, positive holes of larger effective masses than on the side of the conduction band are carriers.

Accordingly, FIGS. 1 and 2 show that a material forming the barrier layer has a wavelength of below 1.0 μm PL to ensure a sufficient wide gap, whereby a sufficient energy difference can be ensured between the energy level of the active layer and the barrier layer.

Next, energy difference between the first energy level and the second energy level of the active layer will be discussed.

On the side of the conduction band, because electrons, carriers have a small effective mass, a sufficient energy difference can be ensured between the first energy level and the second energy level of the active layer. Because usually the barrier wall is not so large on the conduction layer, the second energy level is absent.

Accordingly, on the side of the conduction band, the energy difference between the first energy level and the second energy level of the active layer makes no problem.

On the side of the valence band, positive holes, or carriers, have a large effective mass, it is necessary to consider the energy difference between the first energy level and the second energy level of the active layer, which is different from cases on the side of the conduction band. The positive holes include heavy holes and light holes, which has to be considered.

Figure 3:
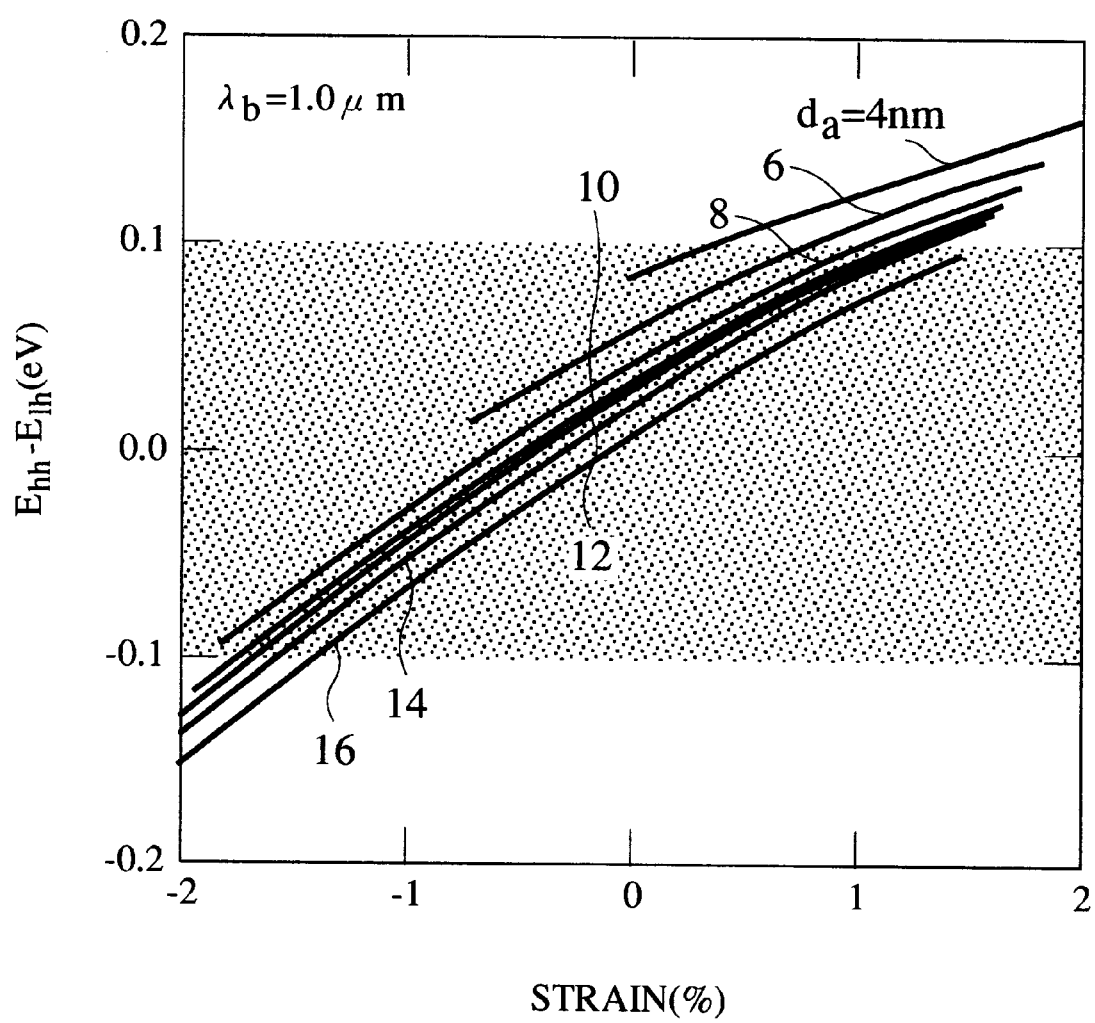
FIG. 3 is a graph of results of simulations of energy differences Ehh–Elh between a first energy level Ehh of heavy positive holes and a first energy level Elh of light positive holes of the active layer on the side of the valence band.

FIG. 3 shows the result of the computation of the energy difference Ehh–Elh between the first energy level Ehh of the heavy positive holes and the first energy level Elh of the light positive holes of the active layer on the side of the valence electrons. Strain quantities (%) applied to the active layer are taken on the horizontal axis, and energy differences Ehh–Elh (eV) are taken on the vertical axis. The positive strain amounts indicate compressive strains, and the negative strain amounts indicate tensile strains. The computation result is of cases that the active layer has a film thickness da from 4 nm to 16 nm. The barrier layer has a 1.0 μm PL wavelength λb.

FIG. 3 shows that the energy level Ehh of the heavy positive holes and the first energy level Elh of the light positive holes have energy relationships opposite to each other in the tensile strain and the compressive strain. For both the tensile strain and the compressive strain, to make the energy difference Ehh–Elh between the heavy positive hole and the light positive hole sufficiently large, it is necessary to set the strain amount at a value above a prescribed value. To make an absolute value of the energy difference Ehh–Elh above 100 meV, it is necessary that a strain amount is at least below −1.4%, or a strain amount is at least above 0.5%. Dependence of the energy difference Ehh–Elh on the film thickness da of the active layer is not so conspicuous.

Figure 4:
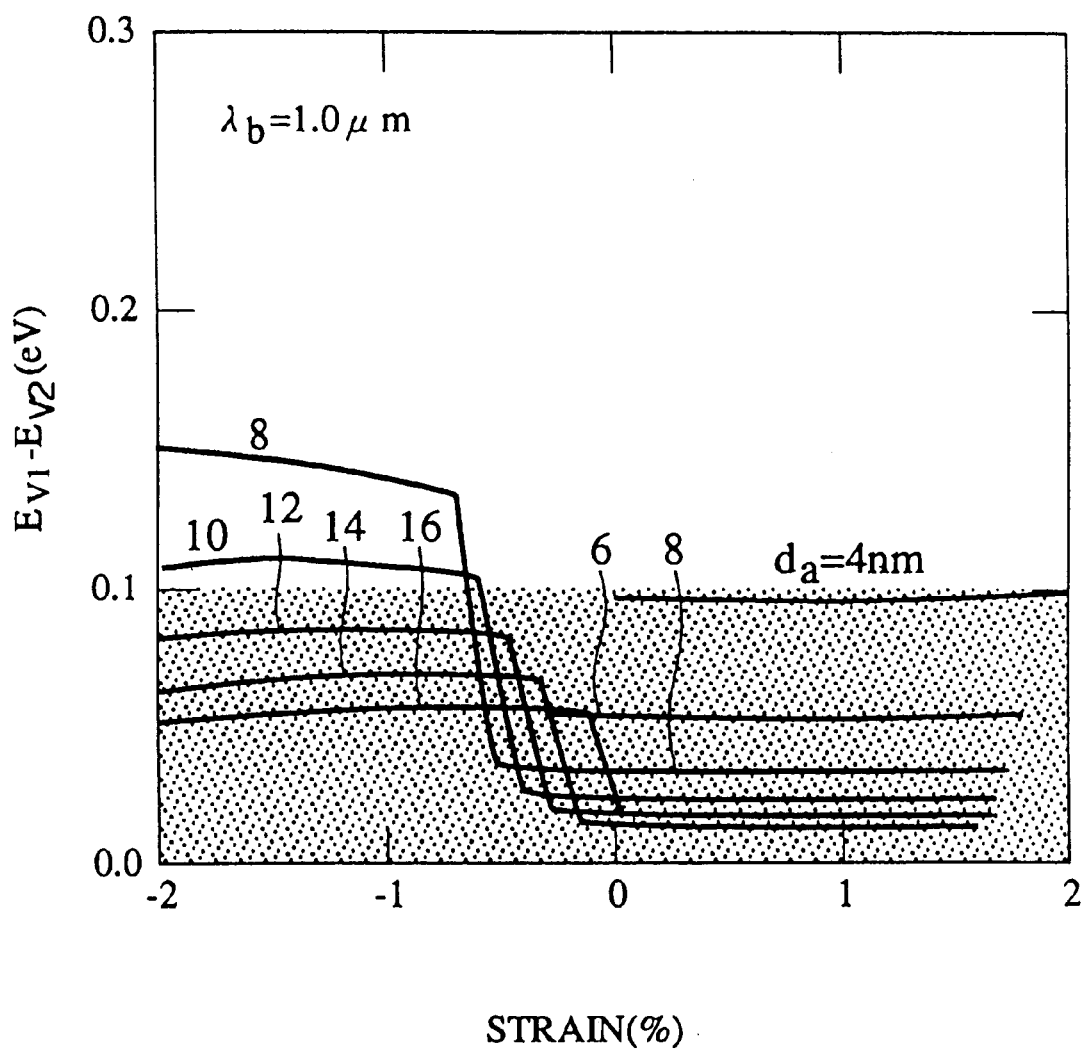
FIG. 4 is a graph of results of simulations of energy differences Ev1–Ev2 between a first energy level Ev1 and a second energy level Ev2 on the side of the valence band.

FIG. 4 shows the result of the computation of the energy difference Ev1–Ev2 between the first energy level Ev1 and the second energy level Ev2 of the valence band. Strain amounts (%) applied to the active layer are taken on the horizontal axis, and energy differences Ev1–Ev2 (eV) are taken on the vertical axis. The positive strain amounts indicate compressive strains, and the negative strain amounts indicate tensile strains. The computation result is of cases that the active layer has a film thickness da from 4 nm to 16 nm. The barrier layer has a 1.0 μm PL wavelength λb.

In FIG. 4, the result of the computation of the energy difference Ev1−Ev2 is discontinuous with strain amount changes, and this is because the first energy level of the active layer of the valence electron band shifts from the first energy level Ehh of the heavy positive holes to the first energy level Elh of the light positive holes.

As shown in FIG. 4, for the tensile strain, a sufficient energy difference Ev1−Ev2 can not be secured unless a film thickness of the active layer is below 11 nm. For the compressive strain, a sufficient energy difference Ev1−Ev2 can not be secured unless a film thickness da of the active layer is about 4 nm.

Based on this analysis results, the following conditions are necessary to ensure an energy difference required to obtain good temperature characteristics:

1) The barrier layer is formed of a material having a below 1.0 μm PL wavelength λb and a sufficiently wide gap;
2) The strain amount has a sufficiently large value which is below −1.4% for the tensile strain and above +0.5% for the compressive strain; and
3) The film thickness da of the active layer is preferably below about 11 nm for the tensile strain and is preferably below about 4.5 nm for the compressive strain.

Figure 5:
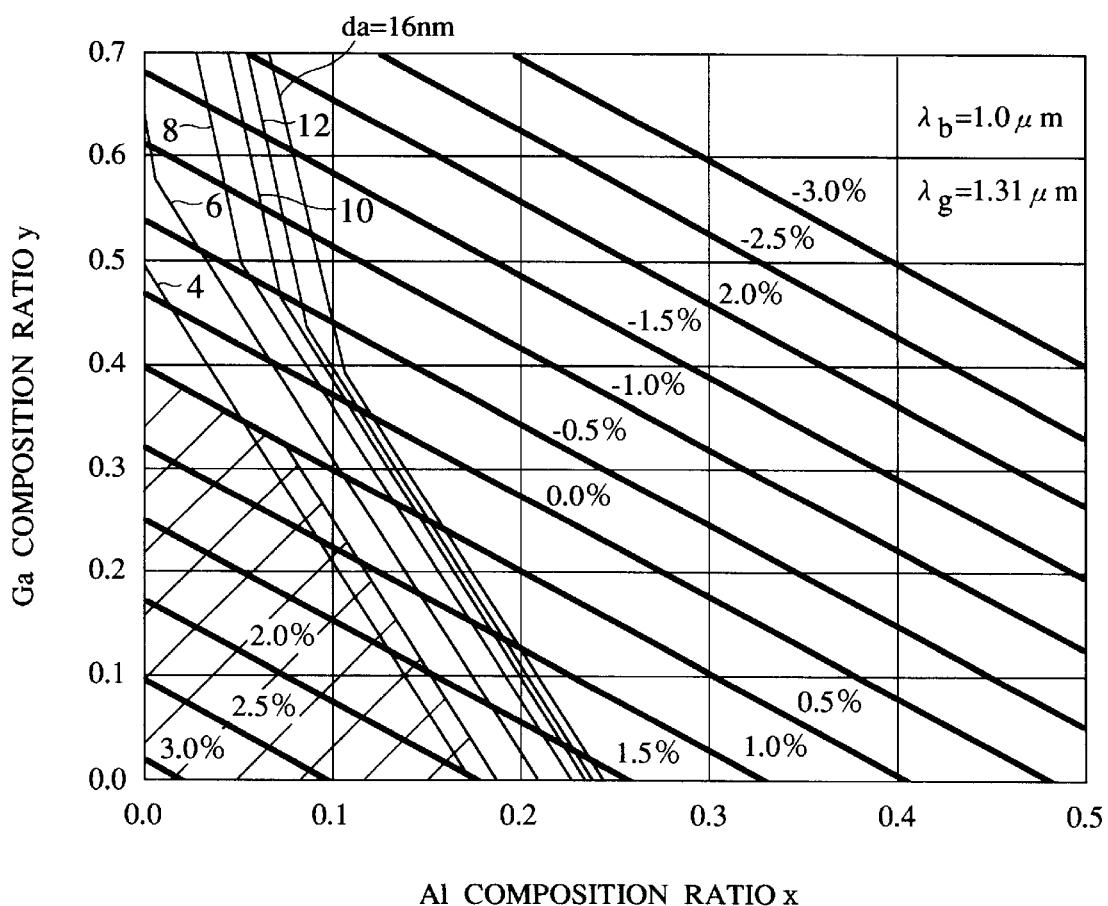
FIG. 5 is a graph of Al composition ratios x and Ga composition ratios y of the active layer of $Al_xGa_yIn_{1-x-y}As$, which shows a range thereof satisfying the conditions of the present invention.

FIG. 5 shows a range of the composition ratio of the active layer which satisfies these conditions.

FIG. 5 shows a range of the composition ratio of an AlGaInAs/InP system material with respect to a optical semiconductor device including a multiple quantum well structure having the barrier layer of a 1.0 μm PL wavelength λb and the active layer of a 1.31 μm PL wavelength λg. When the active layer is an $Al_xGa_yIn_{1-x-y}As$ layer, relationships between Al composition ratios x and Ga composition ratios y with a strain amount changed from −3.0% to +3.0% and a film thickness da of the active layer changed from 4 nm to 16 nm.

As apparent in FIG. 5, the condition that a compressive strain of the active layer is above +0.5% satisfies the following formula $$y \leq 0.4-x$$

The condition that a film thickness da of the active layer is above 4.5 nm satisfies the following formula $$y \leq 0.55-2.75x.$$

Because composition ratios x, y are zero or positive, the following formulas $$x \geq 0$$

$$y \geq 0$$

are satisfied. A range where the above-described four formulas are satisfied is hatched in FIG. 5.

Figure 6:
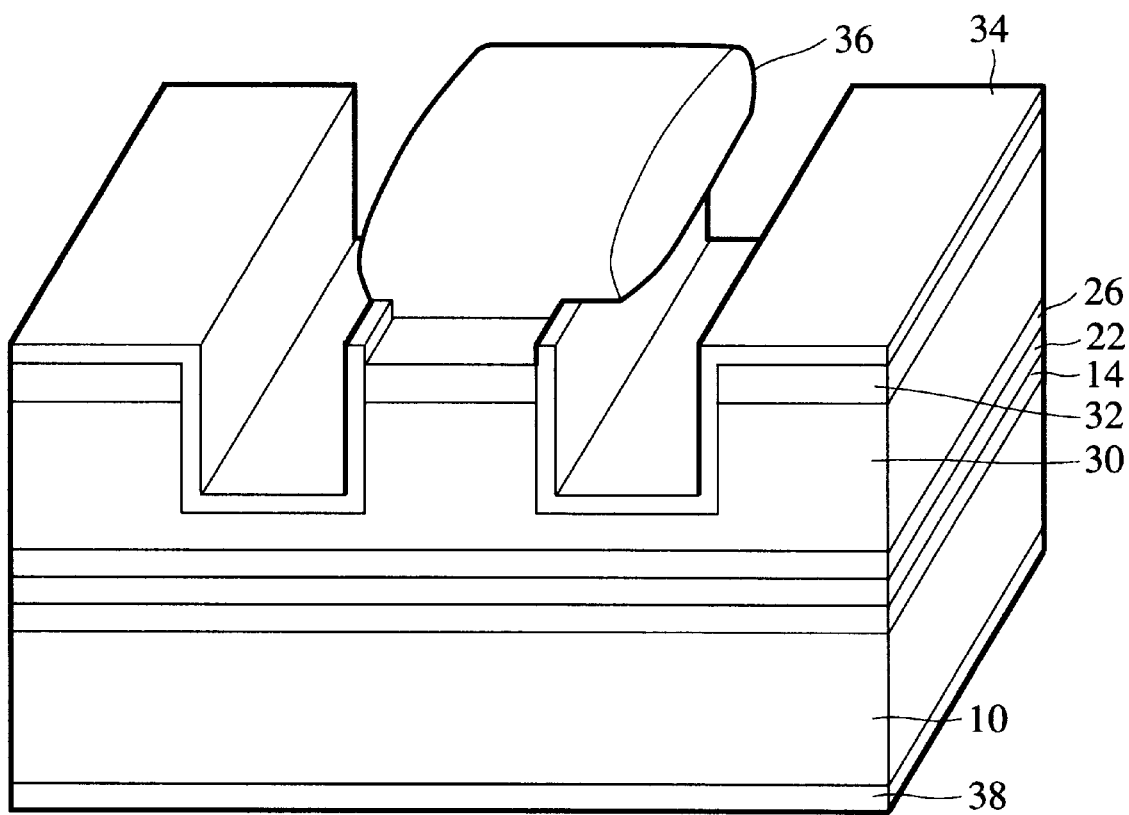
FIG. 6 is a view of a structure of the semiconductor laser according to one embodiment of the present invention.

Then, the semiconductor laser according to one embodiment of the present application will be explained with reference to FIGS. 6 and 7. The semiconductor laser according to the present embodiment satisfies the above-described conditions. FIG. 6 is a view of the semiconductor laser according to the present embodiment, which shows the structure thereof.

An n-$Al_{0.477}In_{0.523}As$ cladding layer 14 of an about 50–400 nm-thickness and an about 5.0 E+17 cm$^{-3}$ impurity concentration is formed on an about 270 μm-thickness n-InP substrate 10 of an 2.0 E+18 cm$^{-3}$ impurity concentration.

A multiple quantum well layer 22 is formed on the n-AlInAs cladding layer 14 through, e.g., an i-$Al_{0.36}Ga_{0.12}In_{0.52}As$ SCH (Separate Confinement Heterostructure) layer (not shown) as required. The multiple quantum well layer 22 comprises, e.g., about 10±5 nm thickness i-$Al_{0.36}Ga_{0.12}In_{0.52}As$ barrier layers, and about 4 nm±1 thickness i-$Al_{0.13}Ga_{0.12}In_{0.75}As$ active layers alternately laid one on another.

An about 50–400 nm-thickness p-$Al_{0.477}In_{0.523}As$ cladding layer 26 of a 5.0 E+17 cm$^{-3}$ impurity concentration, for example, is formed on the multiple quantum well layer 22 through, e.g., an i-$Al_{0.36}Ga_{0.12}In_{0.52}As$ SCH (Separate Confinement Heterostructure) layer (not shown) as required.

A p-InP cladding layer 30 of, e.g., an about 1000±100 nm-thickness and a 1.0 E+18 cm$^{-3}$ impurity concentration is formed on the p-AlInAs cladding layer 26. An about 600 nm-thickness p$^+$-$In_{0.533}Ga_{0.467}As$ contact layer 32 of a 2.0 E+19 cm$^{-3}$ is formed on the p-InP cladding layer 30.

As shown in FIG. 6, the p-InP cladding layer 30 and the p$^+$-InGaAs contact layer 32 are processed to have a ridge structure. The ridge structure is covered with silicon oxide film 34 except the projected portion at the center. An upper electrode 36 of Ti/Pt/Au layer is formed on the exposed portion of the p$^+$-InGaAs contact layer 32 which is not covered with the silicon oxide film 34. After the n-InP semiconductor substrate 10 is thinned from 270 μm to 110 μm, a lower electrode 38 of AuGe/Au layer is formed on the backside of the n-InP semiconductor substrate 10.

The i-AlGaInAs barrier layer of the multiple quantum well layer 22 and the i-AlGaInAs SCH layer have a 1.0 μm PL wavelength.

The i-$Al_{0.3}Ga_{0.12}In_{0.52}As$ barrier layer of the multiple quantum well layer 22 is matched with the n-InP substrate 10 in a lattice constant, and is free from strain. The i-$Al_{0.13}Ga_{0.12}In_{0.75}$ As active layer of the multiple quantum well layer 22 has a larger lattice constant than that of the n-InP substrate 10, and an about 1.5% compressive strain is applied to the active layer.

To evaluate temperature characteristics of the semiconductor laser according to the present embodiment, characteristic temperatures $T_0$ were measured and were compared with those of the conventional semiconductor lasers. The result of the measurement is shown in FIG. 7.

It is known that in the semiconductor laser, as the temperature rises from T1 degree to T2 degree, its threshold current Ith exponentially rises as expressed by the following formula $$Ith = I1 \times \exp\{(T2-T1)/T_0\}.$$

I1 represents a threshold current at T2=T1. A characteristic temperature $T_0$ represents a temperature increase value necessary for the threshold current to be e times ("e" represents a base of natural logarithm, 2.71828 . . . ). With higher characteristic temperatures, changes of a threshold current due to temperatures are smaller, and it can be said that the temperature characteristics are good.

Figure 7:
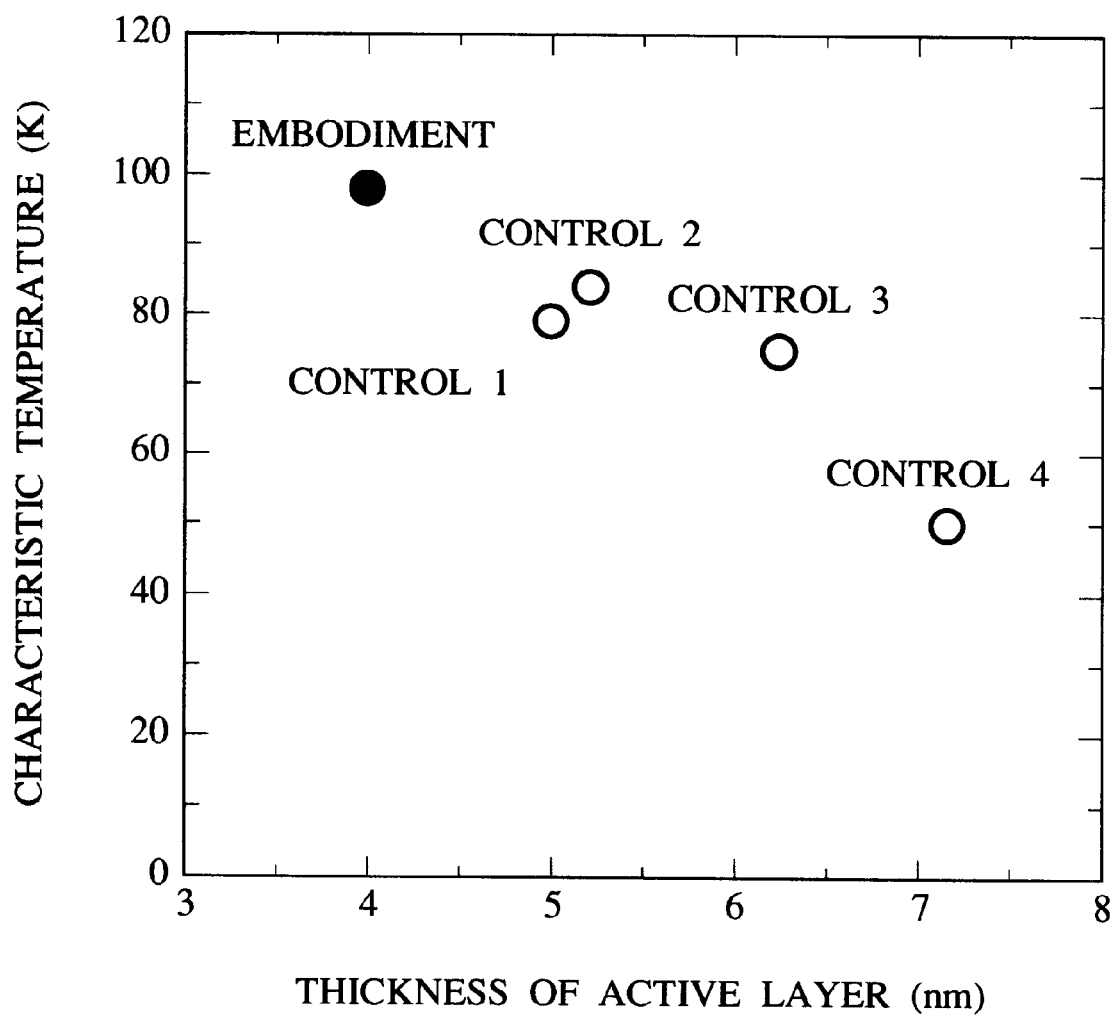
FIG. 7 is a graph of a result of measurement of characteristic temperatures of the semiconductor laser according to the embodiment of the present invention.

FIG. 7 shows the result of the measurement of characteristic temperatures $T_0$ of the semiconductor laser according to the present embodiment in comparison with those of the conventional semiconductor lasers. In FIG. 7, thicknesses (nm) of the active layer 20 are taken on the horizontal axis, and characteristic temperatures $T_0$ (K) are taken on the vertical axis. Characteristic temperatures of the present embodiment are indicated by ●, and those of the control are indicated by o.

A characteristic temperature $T_0$ of the semiconductor laser according to the present embodiment was about 97K. In Control 1, a measured value of the characteristic temperature $T_0$ is 89K when a film thickness da is 5.0 μm in the above-described reference 5) (C. E. Zah et al, 94 OFC, pp. 204–205, 1994). In Controls 2, 3 and 4, when the film thicknesses da are 5.2 μm, 6.2 μm and 7.1 μm in the above-described reference 7) (C. E. Zah et al, 14th ISLC, Th1.3, pp.215–216, 1994), measured values of the characteristic temperature $T_0$ are 83K, 74K and 49K.

As apparent in FIG. 7, the present embodiment has higher characteristic temperatures $T_o$ in comparison with those of the controls, and has smaller threshold current changes due to temperatures. It is found that the present embodiment has good temperature characteristics.

The present invention is not limited to the above-described embodiment and covers various modifications.

For example, in the above-described embodiment the cladding layers are formed of AlInAs system materials but may be formed of other semiconductor materials.

The device structure of the above-described embodiment is only an example of applications of the present inventions, and the present invention is not limited to the device structure of the above-described embodiment.

In the above-described embodiment, the present invention is applied to a semiconductor laser but may be applied to other optical semiconductor devices other than the semiconductor laser.

What is claimed is:

1. An optical semiconductor device including a multiple quantum well structure of an AlGaInAs system material formed on an Inp semiconductor substrate, the multiple quantum well structure comprising:
a barrier layer of a below 1.0 μm-PL wavelength and an active layer of a below 4.5 nm-thickness alternately laid one on another, and
wherein an above 0.5% compressive strain is applied to the active layer.

2. An optical semiconductor device including a multiple quantum well structure of an AlGaInAs system material formed on an InP semiconductor substrate, the multiple quantum well structure comprising:
a barrier layer of a below 1.0 μm-PL wavelength and an active layer of a below 4.5 nm-thickness alternately laid one on another, and
wherein the active layer is an $Al_xGa_yIn_{1-x-y}As$ layer, an Al composition ratio x and a Ga composition ratio y satisfying formulas stated below $y \leq 0.4-x$ $y \leq 0.55-2.75x$ $x \geq 0$ $y \geq 0.$ 3. An optical semiconductor device according to claim 1, wherein the multiple quantum well structure is sandwiched by cladding layers of an AlInAs system material.

4. An optical semiconductor device according to claim 2, wherein the multiple quantum well structure is sandwiched by cladding layers of an AlInAs system material.

* * * * *